US009908771B2

(12) United States Patent
Feyh et al.

(10) Patent No.: US 9,908,771 B2
(45) Date of Patent: Mar. 6, 2018

(54) INERTIAL AND PRESSURE SENSORS ON SINGLE CHIP

(71) Applicant: Robert Bosch GmbH, Stuttgart (DE)

(72) Inventors: Ando Feyh, Reutlingen (DE); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 294 days.

(21) Appl. No.: 14/504,545

(22) Filed: Oct. 2, 2014

(65) Prior Publication Data

US 2015/0096376 A1    Apr. 9, 2015

Related U.S. Application Data

(60) Provisional application No. 61/886,124, filed on Oct. 3, 2013.

(51) Int. Cl.
*B61B 7/02* (2006.01)
*B81B 7/02* (2006.01)
(Continued)

(52) U.S. Cl.
CPC .............. *B81B 7/02* (2013.01); *G01C 25/00* (2013.01); *G01D 21/02* (2013.01); *G01L 19/0092* (2013.01); *G01L 19/12* (2013.01); *G01P 15/0802* (2013.01); *G01P 15/125* (2013.01); *G01P 15/18* (2013.01); *B81B 2201/025* (2013.01); *B81B 2201/0264* (2013.01)

(58) Field of Classification Search
None
See application file for complete search history.

(56) References Cited

U.S. PATENT DOCUMENTS 6,105,428 A  *  8/2000  Schmiesing ........ G01P 15/0802
                                                   361/283.3
6,289,732 B1     9/2001  Murari et al.
(Continued)

FOREIGN PATENT DOCUMENTS

EP    2879988 A2    6/2015
WO    2010107619 A2  9/2010

OTHER PUBLICATIONS

International Search Report and Written Opinion corresponding to PCT Application No. PCT/US2014/058765, dated Jan. 27, 2015 (10 pages).
(Continued)

*Primary Examiner* — Hezron E Williams
*Assistant Examiner* — Jean Morello
(74) *Attorney, Agent, or Firm* — Maginot Moore & Beck LLP

(57) ABSTRACT

In accordance with one embodiment, a single chip combination inertial and pressure sensor device includes a substrate, an inertial sensor including a movable sensing structure movably supported above the substrate, and a first fixed electrode positioned adjacent to the movable sensing structure, and a pressure sensor including a gap formed in the sensor at a location directly above the movable sensing structure, and a flexible membrane formed in a cap layer of the device, the flexible membrane defining a boundary of the gap and configured to flex toward and away from the gap in response to a variation in pressure above the flexible membrane.

19 Claims, 4 Drawing Sheets

(51) Int. Cl.
*G01D 21/02* (2006.01)
*G01P 15/08* (2006.01)
*G01P 15/125* (2006.01)
*G01P 15/18* (2013.01)
*G01C 25/00* (2006.01)
*G01L 19/00* (2006.01)
*G01L 19/12* (2006.01)

(56) References Cited

U.S. PATENT DOCUMENTS

| | | | |
|---|---|---|---|
| 6,432,737 | B1 | 8/2002 | Webster |
| 7,270,008 | B1* | 9/2007 | DeAnna ............... G01M 7/02 73/663 |
| 8,151,640 | B1 | 4/2012 | Kubena |
| 8,220,330 | B2* | 7/2012 | Miller ................ B81B 7/02 73/493 |
| 2006/0134825 | A1 | 6/2006 | DCamp et al. |
| 2010/0043530 | A1* | 2/2010 | Elian ................ B81B 7/0048 73/31.06 |
| 2010/0058865 | A1* | 3/2010 | Zhang ............... G01P 15/0802 73/514.38 |
| 2010/0233791 | A1 | 9/2010 | Sim et al. |
| 2010/0242603 | A1 | 9/2010 | Miller et al. |
| 2011/0126632 | A1* | 6/2011 | McNeil ................. B81B 7/02 73/718 |
| 2012/0043627 | A1* | 2/2012 | Lin ..................... B81B 7/02 257/415 |
| 2012/0234093 | A1* | 9/2012 | Black ................ H01L 41/08 73/504.08 |
| 2012/0261822 | A1* | 10/2012 | Graham .............. B81B 3/0021 257/741 |
| 2013/0001550 | A1 | 1/2013 | Seeger et al. |
| 2013/0277777 | A1* | 10/2013 | Chang ................ B81B 7/00 257/418 |
| 2013/0322675 | A1* | 12/2013 | Zoellin ................ H04R 1/04 381/355 |
| 2014/0035071 | A1* | 2/2014 | Chen ................... H01L 29/84 257/415 |
| 2015/0360936 | A1* | 12/2015 | Tayebi ............... B81C 1/0023 257/369 |

OTHER PUBLICATIONS

Supplemental European Search Report corresponding to European Patent Application 14 85 1277 (6 pages).

* cited by examiner

INERTIAL AND PRESSURE SENSORS ON SINGLE CHIP

CROSS REFERENCE

This application claims the benefit of U.S. Provisional Application No. 61/886,124 filed Oct. 3, 2013, the entire contents of which is herein incorporated by reference.

FIELD OF THE INVENTION

This disclosure relates generally to wafers and substrates such as those used for microelectromechanical system (MEMS) devices or semiconductor devices.

BACKGROUND

Electrostatic MEMS resonators have been a promising technological candidate to replace conventional quartz crystal resonators due to the potential for smaller size, lower power consumption and low-cost silicon manufacturing. Such devices typically suffer, however, from unacceptably large motional-impedance ($R_x$). MEMS devices operating in the out-of-plane direction, i.e., a direction perpendicular to the plane defined by the substrate on which the device is formed, have the advantage of large transduction areas on the top and bottom surfaces, resulting in a reduction in motional-impedances. Consequently, out-of plane devices have received an increasing amount of attention resulting in significant advances in areas such as digital micro-mirror devices and interference modulators.

The potential benefit of out-of-plane electrodes is apparent upon consideration of the factors which influence the $R_x$. The equation which describes $R_x$ is as follows:

$$R_x = \frac{c_r}{\eta^2}; \text{ with } \eta = V\frac{\partial C}{\partial g} = \frac{\varepsilon_0 A V}{g^2}$$

wherein
- "$c_r$" is the effective damping constant of the resonator,
- "$\eta$" is the transduction efficiency,
- "$g$" is the gap between electrodes,
- "$A$" is the transduction area, and
- "$V$" is the bias voltage.

For in-plane devices, "A" is defined as H×L, with "H" being the height of the in-plane component and "L" being the length of the in-plane component. Thus, $\eta$ is a function of H/g and H/g is constrained by the etching aspect ratio which is typically limited to about 20:1. For out-of-plane devices, however, "A" is defined as L×W, with "W" being the width of the device. Accordingly, $\eta$ is not a function of the height of the out-of-plane device. Rather, $\eta$ is a function of (L×W)/g. Accordingly, the desired footprint of the device is the major factor in transduction efficiency. Out-of-plane devices thus have the capability of achieving significantly greater transduction efficiency compared to in-plane devices.

Traditionally, out-of-plane electrodes are not fully utilized because of the difficulty in reliably fabricating such devices. For example, packaging is difficult for out-of-plane devices because out-of-plane electrodes are easily damaged during packaging processes. MEMS resonators incorporating an out-of-plane electrode are particularly challenging because such devices require a vacuum encapsulation process.

Additionally, MEMS sensors are generally fabricated using dedicated process flows for each sensor with each sensor on a unique chip. For example, a pressure sensor is fabricated with a completely different process flow than an inertial sensor and, as a result, it is difficult to fabricate both sensors on a single chip.

What is needed is a device that is fabricated using commonly understood fabrication steps that combines multiple sensing devices of different types on a single chip. It would be beneficial if the device could be realized using a single fabrication process.

SUMMARY

The disclosure advantageously combines the process flows for multiple MEMS sensors, so that they are fabricated on a single chip. For example, some embodiments use the process flow for a capacitive pressure sensor and fabricate an inertial sensor below a pressure sensor. In this way, the pressure sensor is realized within the membrane layer of the device. In some embodiments, the movable portion of the inertial sensor is used as a lower electrode.

Insulating nitride plugs in the membrane layer are used to electrically decouple the various sensing structures for a multi-axis inertial sensor, allowing for fully differential sensing. Additionally, by fabricating the pressure sensor within the membrane layer above the inertial sensor, there is a reduction in the overall sensor area. Such inertial sensing structures have the same design flexibility as current inertial sensors.

In one embodiment, a single chip combination inertial and pressure sensor device includes a substrate, an inertial sensor including a movable sensing structure movably supported above the substrate, and a first fixed electrode positioned adjacent to the movable sensing structure, and a pressure sensor including a gap formed in the sensor at a location directly above the movable sensing structure, and a flexible membrane formed in a cap layer of the device, the flexible membrane defining a boundary of the gap and configured to flex toward and away from the gap in response to a variation in pressure above the flexible membrane.

In one or more embodiments the first fixed electrode is located in the substrate directly beneath the movable sensing structure, and the movable sensing structure is configured as an electrode in the pressure sensor.

In one or more embodiments the movable sensing structure is formed in a device layer, and the device further includes a second fixed electrode formed in the device layer at a first location adjacent to the movable sensing structure, and a third fixed electrode formed in the device layer at a second location adjacent to the movable sensing structure.

In one or more embodiments the device includes a support post extending from the substrate to the cap layer through a hole in the movable sensing structure.

In one or more embodiments a fourth fixed electrode is defined in the cap layer at a location directly between the movable sensing structure and the flexible membrane, the flexible membrane is configured as a movable electrode, the support post extends into the cap layer, and the support post is electrically isolated from the fourth fixed electrode by a non-conductive cap.

In one or more embodiments the device includes a first connector extending between the first fixed electrode and an upper surface of the cap layer, and a nitride spacer within the cap layer, the nitride spacer electrically isolating the first connecter within the cap layer.

In one or more embodiments the first connector extends through a first buried oxide layer located between the substrate and the device layer, and the first connector extends through a second buried oxide layer located between the device layer and the cap layer.

In one or more embodiments the device includes a second connector extending from the second fixed electrode to the upper surface of the cap layer, wherein the nitride spacer includes a first side portion in direct contact with the first connector and a second side portion in direct contact with the second connector.

In one or more embodiments the device includes a piezoresistive element attached to the flexible membrane.

In one embodiment a method of forming a single chip combination inertial and pressure sensor device includes providing a wafer including a buried oxide layer between a handle layer and a device layer, forming a first trench through the device layer and the buried oxide layer to define a sensing structure within the device layer, forming a first oxide portion within the first trench and on an upper surface of the handle layer, forming a first cap portion on an upper surface of the first oxide portion, defining a first membrane portion within the first cap portion directly above the defined sensing structure, releasing the defined sensing structure through vent holes formed through the first membrane portion, forming a second cap portion on an upper surface of the first cap portion, and defining a second membrane portion within the second cap portion directly above the released sensing structure.

In one or more embodiments a method includes forming at least one second trench through the device layer and the buried oxide layer to define at least one electrode within the device layer, and filling the at least one second trench with a first nitride portion prior to forming the first trench, wherein forming the first cap portion includes forming a portion of at least one first connector for the defined at least one electrode by forming the first cap portion within trenches in the first oxide portion.

In one or more embodiments a method includes forming a third trench through the first oxide portion, the handle layer, and the buried oxide layer, the third trench separated within the device layer from the at least one electrode by the first nitride portion, and filling the third trench with a polysilicon deposition, thereby forming a portion of a second connector to an electrode within the handle layer.

In one or more embodiments a method includes forming a fourth trench through the first oxide portion, the handle layer, and the buried oxide layer, the third trench located within an outer perimeter of the defined sensing structure within the device layer, and filling the fourth trench with a polysilicon deposition, thereby forming a post extending upwardly from the handle layer, forming a second oxide portion on an upper surface of the second cap portion at a location directly above the filled further trench, forming an upper cap layer on an upper surface of the second cap portion, etching the second oxide portion through vent holes formed through the second cap portion, and sealing the vent holes in the second cap portion.

In one or more embodiments a method includes forming a fifth trench through the first cap portion to the first oxide portion, and forming a nitride cap, the nitride cap extending within the fifth trench and directly above the post thereby electrically isolating the post within the first cap portion.

In one or more embodiments a method includes forming a piezoresistor on an upper surface of the upper cap layer.

The disclosure is not limited to a capacitive pressure sensor process flow and can also be applied to other transducers, such as piezo-resistive transducers. Further, the disclosure is not limited to the use of a poly-crystalline silicon membrane.

DESCRIPTION

Figure 1:
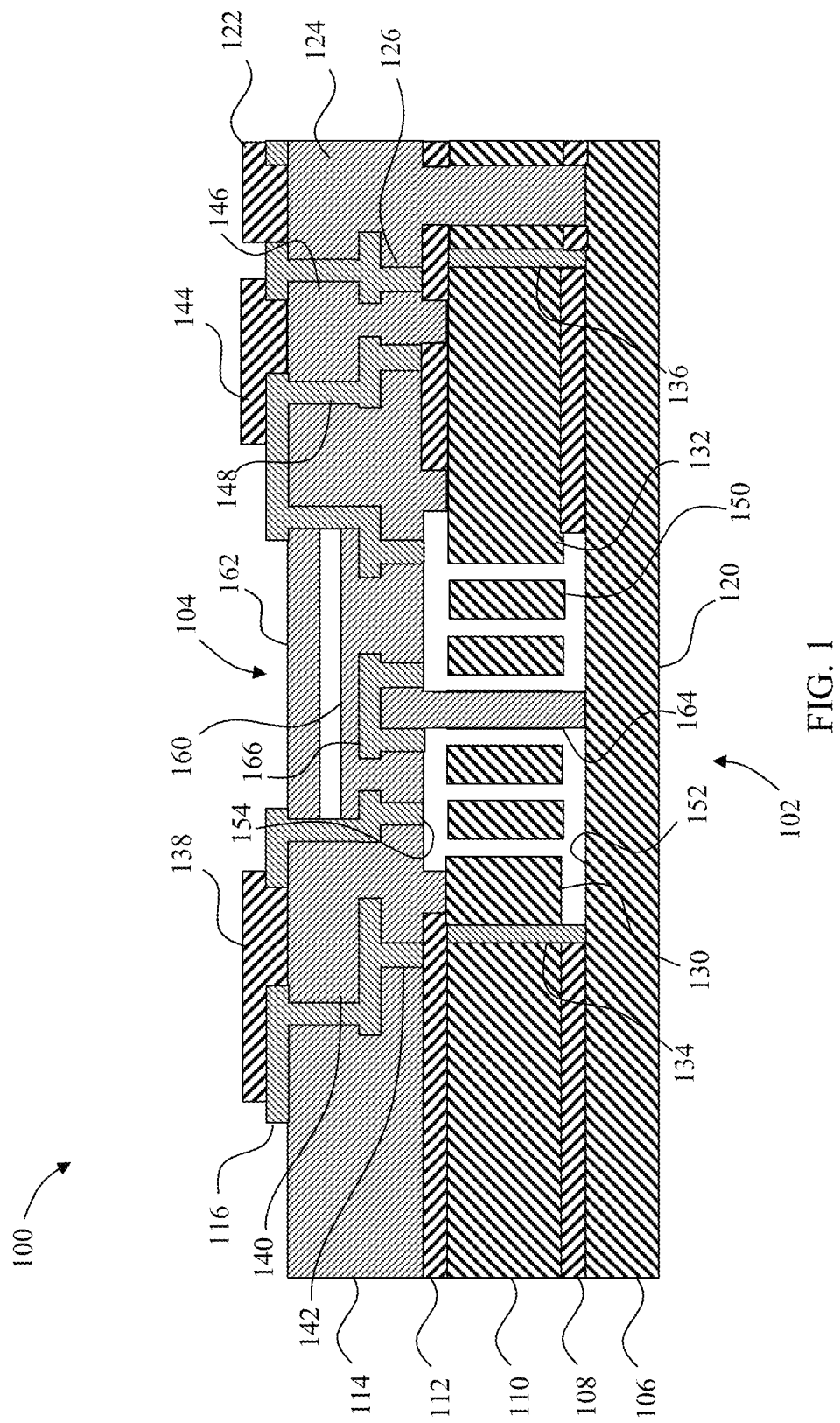
FIG. 1 depicts a side cross-sectional view of a sensor device incorporating in-plane and out-of-plane inertial sensors and a pressure sensor on a single chip, integrated in a vertical way on top of each other.

For the purposes of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art which this disclosure pertains.

FIG. 1 depicts a combination inertial and pressure sensor 100 including an inertial sensor 102 (e.g., an accelerometer and/or a gyroscope with one or multiple sensing axes) and a pressure sensor 104 on a single chip either on top of each other or in a stacked configuration. The combination inertial and pressure sensor 100 includes a handle layer 106, a buried oxide layer 108, and a device layer 110. An oxide layer 112 separates the device layer 110 from a cap layer 114. A remainder 116 of a passivation layer is located above the cap layer 114.

The inertial sensor 102 includes a lower fixed sensor electrode 120 which is in electrical communication with an electrode pad 122 on the upper surface of the cap layer 114 through a connector 124. The connector 124 is electrically isolated from the cap layer 114 by a spacer 126. The inertial sensor 102 further includes two fixed in-plane electrodes 130 and 132 within the device layer 110. The fixed in-plane electrode 130 is electrically isolated from the device layer 110 by a spacer 134 and the fixed in-plane electrode 132 electrically isolated from the device layer 110 by a spacer 136. The fixed in-plane electrode 130 is in electrical communication with a fixed electrode pad 138 on the upper surface of the cap layer 114 through a connector 140 which is electrically isolated from the cap layer 114 by a spacer 142. The fixed in-plane electrode 132 is in electrical communication with a fixed electrode pad 144 on the upper surface of the cap layer 114 through a connector 146 which is electrically isolated from the cap layer 114 by a spacer 148.

The inertial sensor 102 further includes a sensing structure 150. The sensing structure 150 is electrically isolated from the handle layer 106 by a gap 152. A gap 154 electrically isolates the sensing structure 150 from the cap layer 114. The sensing structure 150 is in electrical communication to a connector pad (not shown) through the device layer 110 in a manner similar to the fixed in-plane electrodes 130/132 via anchoring points on which the sending structure is suspended.

The pressure sensor 104 includes a fixed electrode 160 and a membrane 162. The fixed electrode 160 is supported by a support post 164 which extends from the handle layer 106. The support post 164 extends through the sensing structure 150 but is not physically connected to the sensing structure 150. Thus, the sensing structure 150 is free to move to provide in-plane as well as out-of-plane sensing. The support post 164 is electrically isolated from the cap layer 114 by a nitride cap 166.

The membrane 162 in some embodiments functions as a movable electrode. In other embodiments, a piezoresistor (not shown) is positioned on the membrane. In embodiments with a piezoresistor, the nitride cap 166 may be omitted.

The inertial sensor 102 and the pressure sensor 104 of the combination inertial and pressure sensor 100 function in substantially the same manner as other known sensors. Unlike other sensors, the inertial sensor 102 and the pressure sensor 104 are formed using a single process flow while providing a substantially smaller footprint. One exemplary process for forming the combination inertial and pressure sensor 100 is discussed with reference to FIGS. 2-21.

Figure 2:
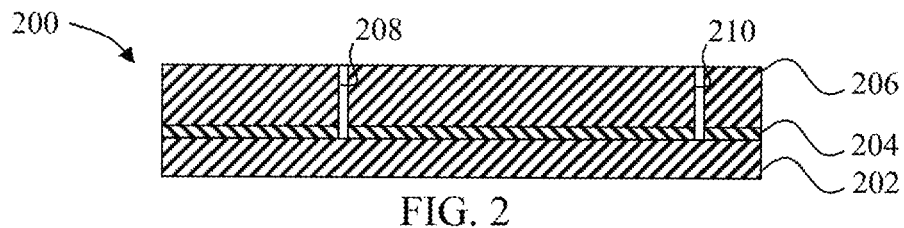
FIGS. 2-14 depict side cross-sectional views of a fabrication process for the sensor device of FIG. 1.
Figure 3:
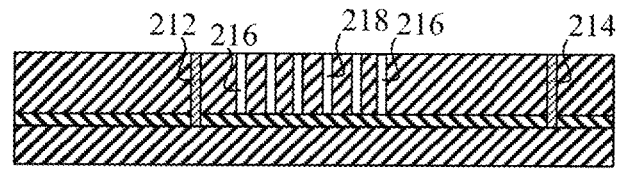

Referring initially to FIG. 2, an SOI wafer 200 including a handle layer 202, a buried oxide layer 204, and a device layer 206 is provided and etched with trenches 208/210 which extend to the handle layer 202. The trenches 208/210 are then filled with trench nitride portions 212/214 and a plurality of trenches 216 and a trench 218 are etched (FIG. 3). The trench 218 in one embodiment defines a cylinder, with the thickness of the trench selected to provide sufficient space between the support post 164 and the sensing structure 150 (see FIG. 1) to allow for the desired in-plane movement of the sensing structure 150. Likewise, the diameter of the trench or trenches 216 is selected to provide sufficient space between the sensing structure 150 and the in-plane electrodes 130/132.

Figure 4:
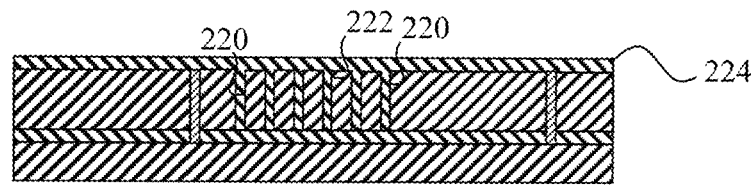

The trench portions 216 and 218 are then filled with trench oxide portions 220/222, respectively, as shown in FIG. 4 using a conformal oxide deposition. Oxide deposition further results in an oxide layer 224 on the upper surface of the device layer 206. The oxide layer 224 may be planarized by any desired technique such as chemical mechanical polishing (CMP).

Figure 5:
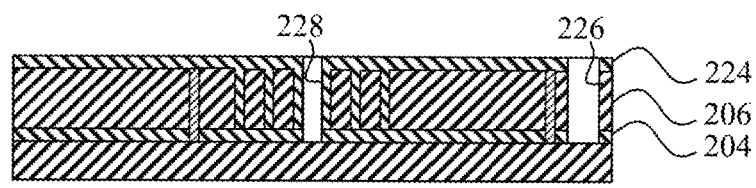
Figure 6:
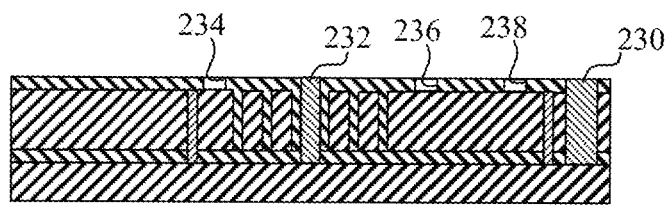

Trenches 226/228 are etched through the oxide layer 224, the device layer 206, and the buried oxide layer 204 to expose the upper surface of the handle layer 202 (FIG. 5). Epi-polysilicon deposition is used to fill the trenches 226/228 with epi-polysilicon deposits 230/232, respectively as shown in FIG. 6. Trenches 234, 236, and 238 are etched through the oxide layer 224.

Figure 7:
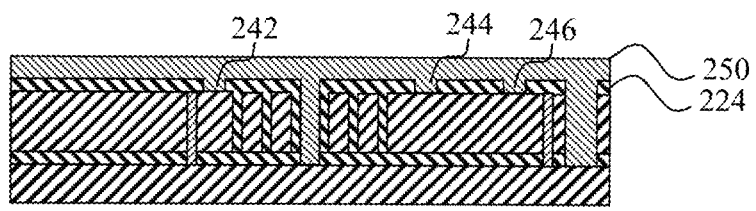
Figure 8:
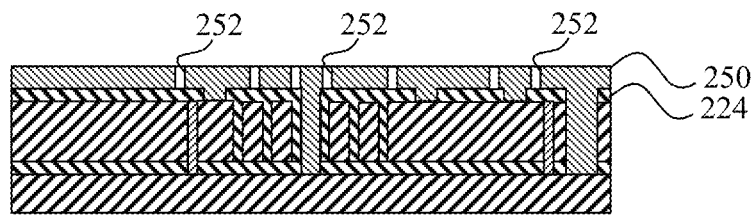
Figure 9:
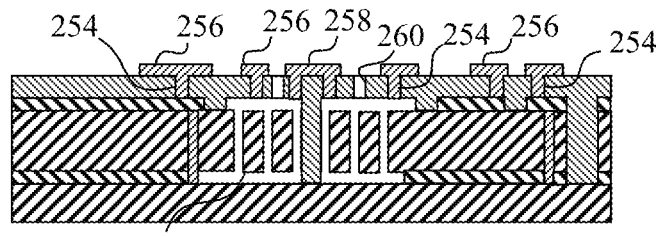

Referring to FIG. 7, an epi-polysilicon deposition is used to fill the trenches 234, 236, and 238 with lower middle contact portions 242, 244, and 246. The epi-polysilicon deposition further results in a lower cap layer portion 250 above the oxide layer 224. A number of trenches 252 are then etched into the cap layer portion 250 (FIG. 8). The trenches 234, 236, and 238 are filled with nitride and a nitride layer is formed on the upper surface of the lower cap portion 250 and then patterned and etched resulting in the configuration of FIG. 9. FIG. 9 thus includes a number of nitride portions 254, nitride gaskets 256, and a nitride cap 258. After forming the nitride portions 254, nitride gaskets 256, and a nitride cap 258, vent holes 260 are formed and an HF vapor etch release is performed which releases sensing structure 262.

Figure 10:
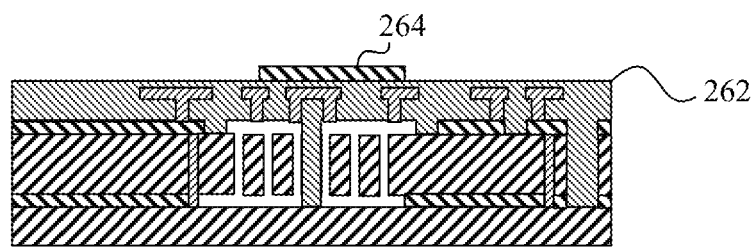
Figure 11:
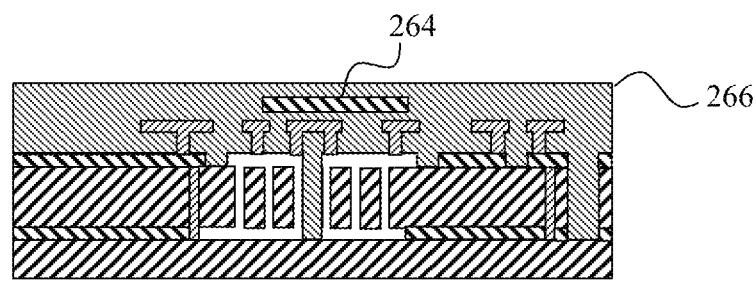

A clean high temperature seal is then performed in an epi-reactor to seal the vent holes 260 and to form a middle cap portion 262 which extends above the nitride gaskets 256 and the nitride cap 258 as shown in FIG. 10. An oxide remnant 264 is also shown in FIG. 10. The oxide remnant is formed by depositing and patterning an oxide layer on the upper surface of the middle cap portion 262.

Figure 12:
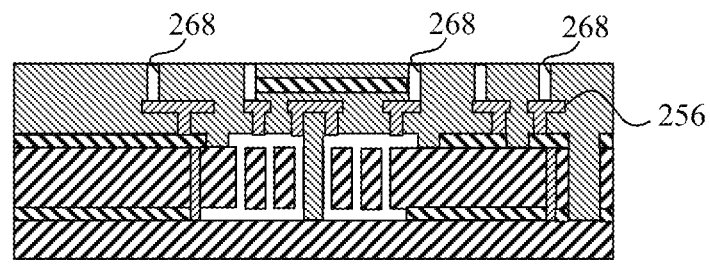
Figure 13:
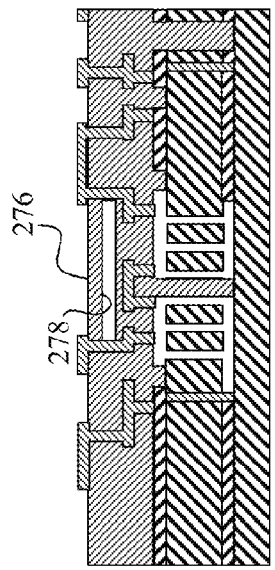
Figure 14:
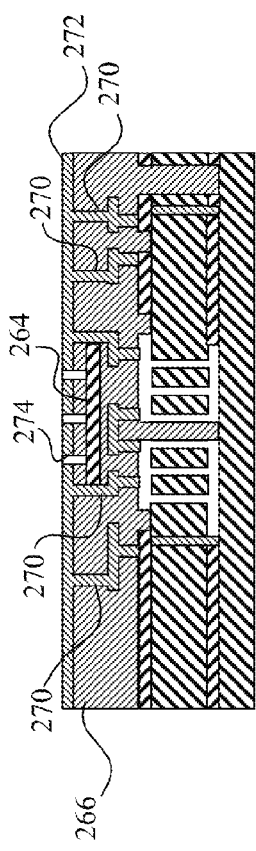

An upper cap portion 266 (see FIG. 11) is then formed on the upper surface of the oxide remnant 264 and the middle cap portion 262, and trenches 268 are formed. The trenches 268 each extend to a respective one of the nitride gaskets 256 (FIG. 12). The trenches directly adhere to the perimeter of the oxide remnant 264 (full enclosure of the perimeter). The configuration of FIG. 13 is then achieved by filling the trenches 268 with nitride portions 270 while forming a nitride layer 272 on the upper surface of the upper cap portion 266. Trenches 274 to the buried oxide remnant 264 are formed by first etching through the nitride layer 272 and then etching through a portion of the upper cap portion 266.

A vapor etch is performed to remove the buried oxide remnant 264 and an epi-seal is performed to seal the trenches 274. The nitride layer 272 is then patterned and etched resulting in the configuration of FIG. 14 wherein the membrane 276 is positioned above a gap 278 formed by etching the buried oxide remnant 264. Connector pads are then added as desired resulting in the configuration of FIG. 1.

Figure 15:
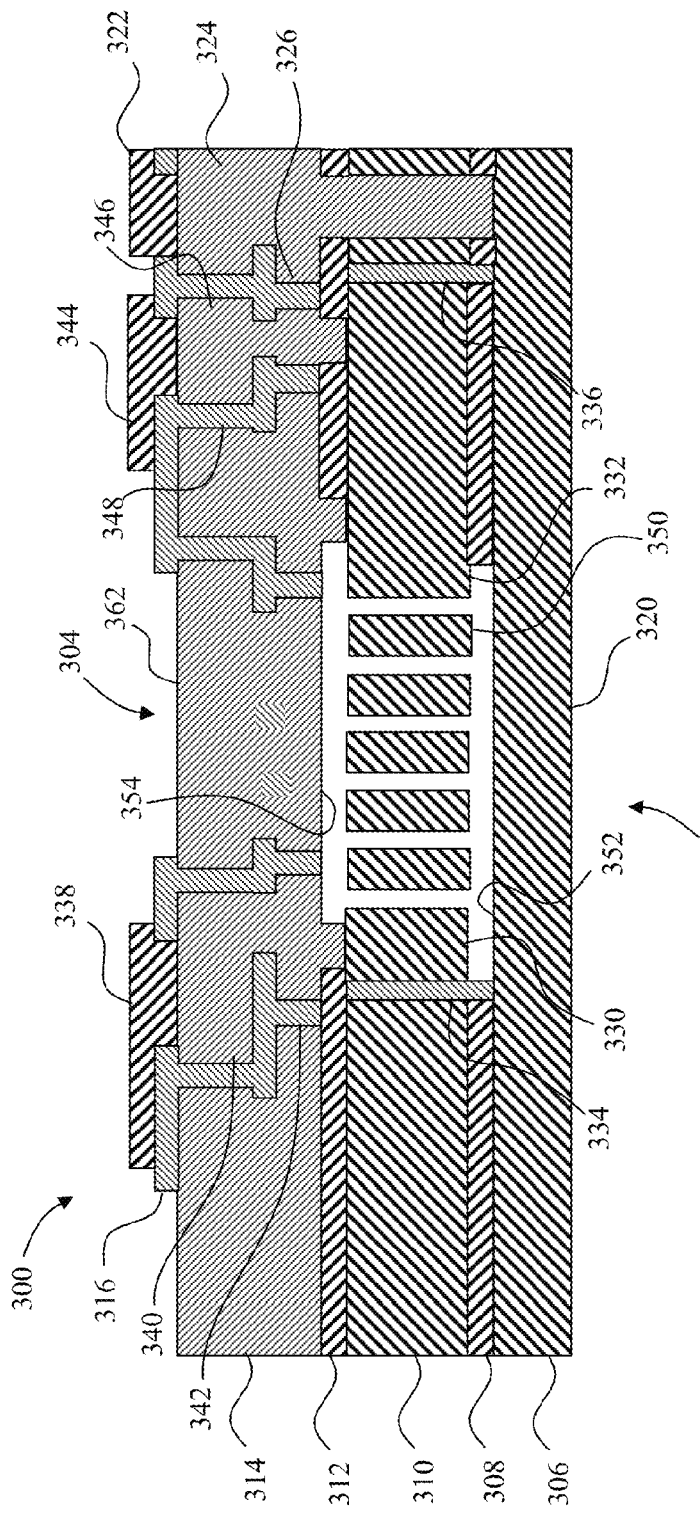
FIG. 15 depicts a side cross-sectional view of a sensor device similar to that of FIG. 1 wherein the sensing member of the inertial sensor functions as a fixed electrode for a pressure sensor.

In some embodiments the above described process is modified by omitting the formation of the support post 164 and the gap 278. The resulting configuration is shown in FIG. 15 which depicts a combination inertial and pressure sensor 300 including an inertial sensor 302 and a pressure sensor 304. The combination inertial and pressure sensor 300 includes a handle layer 306, a buried oxide layer 308, and a device layer 310. An oxide layer 312 separates the device layer 310 from a cap layer 314. A remainder 316 of a passivation layer is located above the cap layer 314.

The inertial sensor 302 includes a lower fixed sensor electrode 320 which is in electrical communication with a lower electrode pad 322 on the upper surface of the cap layer 314 through a connector 324. The connector 324 is electrically isolated from the cap layer 314 by a spacer 326. The inertial sensor 302 further includes two fixed in-plane electrodes 330 and 332 within the device layer 310. The fixed in-plane electrode 330 electrically isolated from the device layer 310 by a spacer 334 and the fixed in-plane electrode 332 electrically isolated from the device layer 310 by a spacer 336. The fixed in-plane electrode 330 is in electrical communication with a fixed electrode pad 338 on the upper surface of the cap layer 314 through a connector 340 which is electrically isolated from the cap layer 314 by a spacer 342. The fixed in-plane electrode 332 is in electrical communication with a fixed electrode pad 344 on the upper surface of the cap layer 314 through a connector 346 which is electrically isolated from the cap layer 314 by a spacer 348.

The inertial sensor 302 further includes a sensing structure 350. The sensing structure 350 is electrically isolated from the handle layer 306 by a gap 352. A gap 354 electrically isolates the sensing structure 350 from the cap layer 314. The sensing structure 350 is in electrical communication to a connector pad (not shown) through the device layer 310 in a manner similar to the fixed in-plane electrodes 330/332. The fixed in-plane electrodes and the movable sensing structure 350 form together e.g. an in-plane accelerometer.

The pressure sensor 304 includes a membrane 362. The gap 354 allows the membrane to move. Thus, a piezoelectric element is provided on the membrane 362 in some embodiments. In other embodiments, the sensing structure 350 serves as a "fixed" electrode. Input from the lower electrode pad 322 in such embodiments is used to compensated for movement of the sensing structure 350 in the z-axis so that the sensing structure 350 is in effect "fixed" with respect to the movable electrode formed by the membrane 362.

The above described processes may be further modified in a number of ways to provide additional features. For example, it is sometimes beneficial to have a large structural layer thickness for an inertial sensor area and a lower structural thickness in a pressure sensor area in order to have good sensitivity for both sensors. A pressure sensor membrane is preferably 5-20 µm thick, while the inertial sensor functional layer is preferably 10-40 µm thick.

In accordance with the above described embodiments, a pressure sensor and an accelerometer are fabricated on a single chip. In some embodiments, a pressures sensor and a gyroscope are fabricated on a single chip. In other embodiments, a 7-degree of freedom combination chip is fabricated having a pressure sensor, a 3-axis accelerometer, and a 3-axis gyroscope. In some embodiments, the chip has magnetometer functionality (e.g. hall sensor).

In some embodiments, a 10-degree of freedom combination chip is fabricated having a 3-axis magnetometer is realized on an application-specific integrated circuit (ASIC), as an add-on chip, or as a Lorentz-force magnetometer in the same process flow as the inertial sensor part on the same MEMS chip.

The above described embodiments thus provide a pressure sensor within an epi-polysilicon encapsulation layer. The pressure sensor in some embodiments is a capacitive pressure sensor with the epi-polysilicon encapsulation layer functioning as a movable electrode. The above described embodiments provide a low-cost combination sensor with a small footprint.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A single chip combination inertial and pressure sensor device, comprising:
  a substrate;
  an inertial sensor including a movable sensing structure movably supported above the substrate, and a first fixed electrode positioned adjacent to the movable sensing structure;
  a pressure sensor including a gap formed in the pressure sensor at a location directly above the movable sensing structure, and a flexible membrane formed in a cap layer of the device, the flexible membrane defining a boundary of the gap and configured to flex toward and away from the gap in response to a variation in pressure above the flexible membrane; and
  a support post extending from the substrate to the cap layer through a hole in the movable sensing structure.

2. A single chip combination inertial and pressure sensor device, comprising:
  a substrate;
  an inertial sensor including a movable sensing structure movably supported above the substrate, and a first fixed electrode positioned adjacent to the movable sensing structure; and
  a pressure sensor including a gap formed in the pressure sensor at a location directly above the movable sensing structure, and a flexible membrane formed in a cap layer of the device, the flexible membrane defining a boundary of the gap and configured to flex toward and away from the gap in response to a variation in pressure above the flexible membrane, wherein:
  the first fixed electrode is located in the substrate directly beneath the movable sensing structure; and
  the movable sensing structure is configured as an electrode in the pressure sensor.

3. The device of claim 2, wherein the movable sensing structure is formed in a device layer, the device further comprising:
  a second fixed electrode formed in the device layer at a first location adjacent to the movable sensing structure; and
  a third fixed electrode formed in the device layer at a second location adjacent to the movable sensing structure.

4. The device of claim 3, wherein:
  the flexible membrane is configured as a movable electrode.

5. The device of claim 4, further comprising:
  a first connector extending between the first fixed electrode and an upper surface of the cap layer; and
  a nitride spacer within the cap layer, the nitride spacer electrically isolating the first connecter within the cap layer.

6. The device of claim 5, wherein:
  the first connector extends through a first buried oxide layer located between the substrate and the device layer; and
  the first connector extends through a second buried oxide layer located between the device layer and the cap layer.

7. The device of claim 6, further comprising:
  a second connector extending from the second fixed electrode to the upper surface of the cap layer, wherein the nitride spacer includes a first side portion in direct contact with the first connector and a second side portion in direct contact with the second connector.

8. The device of claim 7, further comprising:
  a piezoresistive element attached to the flexible membrane.

9. The device of claim 3, wherein:
  a fourth fixed electrode is defined in the cap layer at a location directly between the movable sensing structure and the flexible membrane;
  the flexible membrane is configured as a movable electrode;
  the support post extends into the cap layer; and
  the support post is electrically isolated from the fourth fixed electrode by a non-conductive cap.

10. The device of claim 9, further comprising:
  a first connector extending between the first fixed electrode and an upper surface of the cap layer; and
  a nitride spacer within the cap layer, the nitride spacer electrically isolating the first connecter within the cap layer.

11. The device of claim 10, wherein:
  the first connector extends through a first buried oxide layer located between the substrate and the device layer; and
  the first connector extends through a second buried oxide layer located between the device layer and the cap layer.

12. The device of claim 11, further comprising:
a second connector extending from the second fixed electrode to the upper surface of the cap layer, wherein the nitride spacer includes a first side portion in direct contact with the first connector and a second side portion in direct contact with the second connector.

13. The device of claim 2, further comprising:
a piezoresistive element attached to the flexible membrane.

14. A single chip stacked inertial and pressure sensor device, comprising:
a substrate;
an inertial sensor including a movable sensing structure movably supported above the substrate, and a first and second fixed electrodes positioned adjacent to the movable sensing structure; and
a pressure sensor including a gap formed in the pressure sensor at a location adjacent to the movable sensing structure, and a flexible membrane formed in a cap layer of the device, the flexible membrane defining a boundary of the gap and configured to flex toward and away from the gap in response to a variation in pressure above the flexible membrane;
wherein one of the first or second fixed electrodes is located in the substrate beneath the movable sensing structure and the movable sensing structure is configured as an electrode in the pressure sensor.

15. The device of claim 14, wherein:
the flexible membrane is configured as a movable electrode.

16. The device of claim 14, further comprising:
a first connector extending between the first fixed electrode and an upper surface of the cap layer; and
a nitride spacer within the cap layer, the nitride spacer electrically isolating the first connecter within the cap layer.

17. The device of claim 16, wherein:
the first connector extends through a first buried oxide layer located between the substrate and the device layer; and
the first connector extends through a second buried oxide layer located between the device layer and the cap layer.

18. The device of claim 17, further comprising:
a second connector extending from the second fixed electrode to the upper surface of the cap layer, wherein the nitride spacer includes a first side portion in direct contact with the first connector and a second side portion in direct contact with the second connector.

19. The device of claim 14, further comprising:
a piezoresistive element attached to the flexible membrane.

* * * * *